United States Patent [19]
Pal et al.

[11] Patent Number: 4,895,576
[45] Date of Patent: Jan. 23, 1990

[54] METHOD OF DOPING INTERCONNECTIONS FOR ELECTROCHEMICAL CELLS

[75] Inventors: Uday B. Pal, Monroeville; Subhash C. Singhal, Murrysville; David M. Moon, Pittsburgh; George R. Folser, Lower Burrell, all of Pa.

[73] Assignee: Westinghouse Electric Corp., Pittsburgh, Pa.

[21] Appl. No.: 182,277

[22] Filed: Apr. 15, 1988

[51] Int. Cl.$^4$ .................... H01M 6/00; B05D 5/12; C23C 16/00
[52] U.S. Cl. ..................................... 29/623.5; 429/31; 429/32; 427/105; 427/115; 427/253; 427/255.2
[58] Field of Search ............ 427/105, 115, 253, 255.2, 427/343; 429/30, 31, 32; 29/623.5

[56] References Cited

U.S. PATENT DOCUMENTS 4,597,170 7/1986 Isenberg ............................. 29/623.5
4,631,238 12/1986 Ruka ..................................... 429/30

Primary Examiner—Stephen J. Kalafut
Attorney, Agent, or Firm—Daniel P. Cillo

[57] ABSTRACT

A dense, electronically conductive interconnection layer 26 is bonded on a porous, tubular, electronically conductive air electrode structure 16, optionally supported by a ceramic support 22, by (A) forming a layer of oxide particles of at least one of the metals Ca, Sr, Co, Ba or Mg on a part 24 of a first surface of the air electrode 16, (B) heating the electrode structure, (C) applying a halide vapor containing at least lanthanum halide and chromium halide to the first surface and applying a source of oxygen to a second opposite surface of the air electrode so that they contact at said first surface, to cause a reaction of the oxygen and halide and cause a dense lanthanum-chromium oxide structure to grow, from the first electrode surface, between and around the oxide particles, where the metal oxide particles get incorporated into the lanthanum-chromium oxide structure as it grows thicker with time, and the metal ions in the oxide particles diffuse into the bulk of the lanthanum-chromium oxide structure, to provide a dense, top, interconnection layer 26 on top of the air electrode 16. A solid electrolyte layer 18 can be applied to the uncovered portion of the air electrode, and a fuel electrode 20 can be applied to the solid electrolyte, to provide an electrochemical cell 10.

17 Claims, 3 Drawing Sheets

METHOD OF DOPING INTERCONNECTIONS FOR ELECTROCHEMICAL CELLS

GOVERNMENT CONTRACT

The Government of the United States of America has rights in this invention pursuant to Contract No. DE-AC-0280-ET-17089, awarded by the U.S. Department of Energy.

BACKGROUND OF THE INVENTION

1. Field of the Invention

The present invention relates to interconnection layers for solid oxide electrolyte, electrochemical cells.

2. Description of the Prior Art

High temperature electrochemical cells are taught by Isenberg, in U.S. Pat. No. 4,490,444. In these type of cells, typified by fuel cells, a porous support tube of calcia stabilized zirconia, has an air electrode cathode deposited on it. The air electrode may be made of, for example, doped oxides of the perovskite family, such as $LaMnO_3$. Preferred dopants are Sr, Ca, Co, Ni, Fe, and Sn. Surrounding the major portion of the outer periphery of the air electrode is a layer of gas-tight solid electrolyte, usually yttria stabilized zirconia. A selected radial segment of the air electrode is covered by an interconnection material. The interconnection material may be made of a doped lanthanum chromite film. Suggested dopants are Mg, Ca, and Sr.

Both the electrolyte and interconnect material are applied on top of the air electrode by a modified chemical vapor deposition process, with the suggested use of vaporized halides of zirconium and yttrium for the electrolyte, or vaporized halides of lanthanum, chromium, magnesium, calcium or strontium for the interconnection material, at temperatures of up to 1450° C., as taught by Isenberg, in U.S. Pat. No. 4,597,170, and Isenberg et al., in U.S. Pat. No. 4,609,562.

It has been found that there are certain thermodynamic and kinetic limitations in doping the interconnection from a vapor phase by a chemical vapor deposition process at 1300° C. to 1450° C. The vapor pressures of the calcium chloride, strontium chloride, cobalt chloride, and barium chloride are low at vapor deposition temperatures, and so, are not easily transported to the reaction zone at the surface of the air electrode. Thus, magnesium is the primary dopant used for the interconnection material. However, magnesium doped lanthanum chromite, for example $La_{0.97}Mg_{0.03}CrO_3$, has a 12% to 14% thermal expansion mismatch with the air electrode and electrolyte materials. Additionally, halide vapors at 1300° C. to 1450° C. can interact with the air electrode material during the initial period of interconnection application. This causes, in some instances, air electrode leaching of main constituents, such as manganese, into the interconnection material providing a Mn-Cr rich interconnection phase at the interconnection-air electrode interface. During prolonged cell operation, the Mn can diffuse into the interconnection bulk and cause possible destabilization effects.

In an attempt to solve some of these problems, Isenberg et al., in U.S. Pat. No. 4,598,467, suggested applying a separate, vapor deposited, interlayer of, for example, calcium and cobalt doped yttrium chromite, about 1 micron thick (0.001 millimeter), between the air electrode, and the interconnection material and electrolyte. This, however, added another step to the process, adding further expense and complication. Additional potential problems with the vapor deposited interconnection material are a certain amount of interface porosity, non-uniform distribution of the Mg dopant, leading to decreased conductivity, and a possible minor amount of gas leakage resulting from non-uniform densification.

Ruka, in U.S. Pat. No. 4,631,238, in an attempt to solve interconnection thermal expansion mismatch problems, taught cobalt doped lanthanum chromite, preferably also doped with magnesium, for example $LaCr_{0.93}Mg_{0.03}Co_{0.04}O_3$, as a vapor deposited interconnection material, using chloride vapors of lanthanum, chromium, magnesium, and cobalt.

None of these solutions, however, solve all the potential problems of thermal expansion mismatch, Mn leaching from the air electrode, concentration of Mg dopant near the air electrode interface, and interface porosity, and the limitations of doping calcium, strontium, cobalt, and barium by vapor deposition, in a simple and economical fashion. It is an object of this invention to solve such problems.

SUMMARY OF THE INVENTION

Accordingly, the present invention resides in a method of bonding a dense, electronically conductive layer on a porous, electronically conductive electrode structure, characterized by the steps of: (A) forming a layer of discrete metal oxide particles, where the metal is selected from the group consisting of Ca, Sr, Co, Ba, Mg, and mixtures thereof, preferably CaO, on a portion of a first surface of a porous, electronically conductive, metal oxide, electrode structure, (B) heating said electrode structure, (C) applying metal halide vapor, comprising lanthanum halide and chromium halide, to said first surface of the porous electrode structure, and applying a source of oxygen to a second, opposite surface of the porous electrode structure, in a manner effective that oxygen contacts halide vapor at said first surface of the porous electrode structure, and (D) allowing a time effective to cause a reaction of the oxygen with the metal halide vapor, and cause a dense, lanthanum-chromium oxide structure to grow between and around the metal oxide particles, where metal oxide particles get incorporated into the lanthanumchromium oxide structure as it grows thicker with time, and the metal ions of the incorporated metal oxide particles diffuse into the bulk of the lanthanum-chromium oxide structure, to provide a dense, electronically conductive layer on the porous electrode structure. At the end of the process, there is a complete disappearance of the discrete metal oxide particles. The term "discrete metal oxide particles" as used herein means discrete bodies of oxide material which usually contain an agglomeration of smaller particles, i.e. discrete agglomerates.

Preferably, the porous electrode structure is a cathode made of strontium doped lanthanum manganite, in the form of a tubular structure, optionally supported by a porous, stabilized zirconia support tube. In this process, magnesium halide can also be used in the mixture of metal halide vapors. Reaction and diffusion heating is at a temperature over 1,000° C., preferably in a two step sequence, the first step at approximately 1,300° C. to 1,450° C. for ½ hour to 2 hours, in hydrogen gas, to cause $LaCrO_3$ growth over and around the metal oxide particles, thus incorporating the particles into the structure, followed by second step heating, at approximately 1,100° C. to 1,400° C. for an additional 1 hour to 12 hours, in air or oxygen, to further cause most of the Ca, Sr, Co, Ba or Mg ion diffusion into the LaCrO$_3$ interconnection. This annealing, second step heating, dramatically reduces the resistance of the dense, electronically conductive layer, making it an excellent interconnection layer, for series connection to adjacent cells.

Additional steps, including applying a solid electrolyte layer over the remaining portion of the air cathode, and applying a cermet fuel electrode anode over the electrolyte, will complete formation of an electrochemical cell. This method allows easy Ca, Sr, Co, Ba or Mg doping of the interconnection, lowering thermal mismatch with the air electrode and electrolyte, increasing the growth rate of the interconnection layer, and decreasing manganese leaching from the air electrode.

BRIEF DESCRIPTION OF THE DRAWINGS

In order that the invention can be more clearly understood, conventional embodiments thereof will now be described, by way of example, with reference to the accompanying drawings, in which.

DESCRIPTION OF THE PREFERRED EMBODIMENTS

Figure 1:
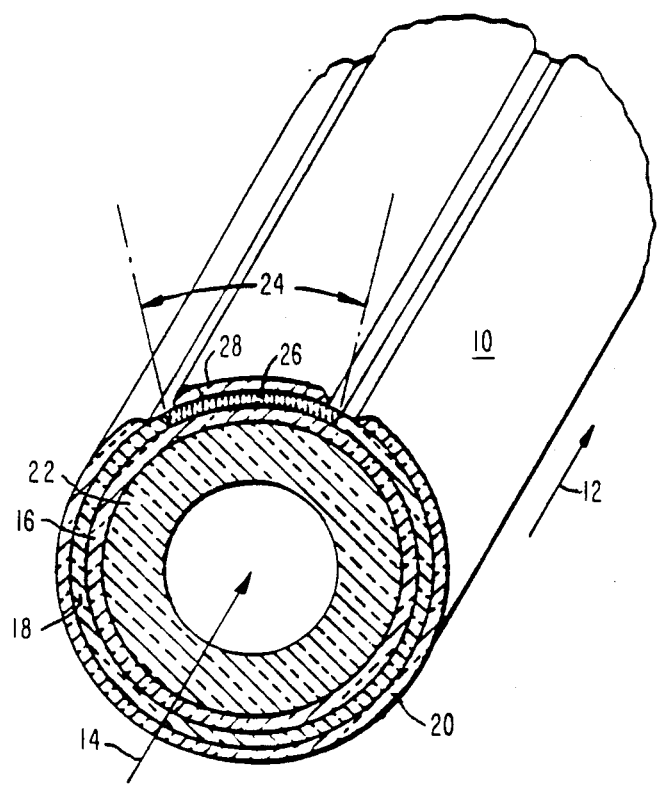
FIG. 1 is a schematic sectional view of a preferred embodiment of a single, tubular electrochemical cell, showing the interconnection layer on top of a supporting electrode.

Referring now to FIG. 1 of the Drawings, a preferred, tubular, electrochemical cell 10 is shown. The preferred configuration is based upon a fuel cell system, wherein a flowing gaseous fuel such as hydrogen or carbon monoxide, is directed axially over the outside of the cell, as indicated by the arrow 12, and an oxidant, such as air, or O$_2$ indicated by the arrow 14, flows through the inside of the cell. Where the cell is as shown, oxygen molecules pass through porous electronically conductive electrode structure 16 and are changed to oxygen ions which pass through the electrolyte 18, to combine with fuel at the fuel electrode 20. It should be noted that the following description of the preferred tubular configuration should not be considered limiting. It should also be noted that the interconnection material of this invention, described hereinafter, could be applied to electrochemical cells other than fuel cells. The term "air electrode" as used throughout means that electrode which will be in contact with oxidant, and "fuel electrode" means that electrode that will be in contact with fuel.

The cell 10 can include an optional, porous support tube 22. The support tube can be comprised of calcia stabilized zirconia, forming a porous wall approximately one to two millimeters thick. The air electrode, or cathode 16 is a porous, composite metal oxide structure approximately 50 microns to 1,500 microns (0.05 millimeter to 1.5 millimeter) thick. It can be deposited on the support tube by well known slurry dip and sinter techniques, or extruded as a self-supporting structure. The air cathode is, for example, comprised of doped oxides or mixtures of oxides of the perovskite family, such as LaMnO$_3$, CaMnO$_3$, LaNiO$_3$, LaCoO$_3$, LaCrO$_3$, and the like. Preferred dopants are strontium, calcium, cobalt, nickel, iron, and tin.

Surrounding most of the outer periphery of the air electrode 16 is a layer of gas-tight solid electrolyte 18, generally comprised of yttria stabilized zirconia about 1 micron to about 100 microns thick (0.001 millimeter to 0.1 millimeter). The electrolyte 18 can be deposited onto the air electrode by well known, high temperature, vapor deposition techniques. In the case where electrolyte is to be deposited before the interconnection, a selected radial segment or portion 24 of the air electrode 16 is masked during electrolyte deposition and then a layer of a non-porous interconnection material 26 is deposited on this segment or portion 24. If the interconnection is to be deposited first then the electrolyte portion is masked initially.

The dense interconnection material 26, which preferably extends the active axial length of each elongated cell 10 as shown, must be electrically conductive in both an oxidant and fuel environment. The gas-tight interconnection 26 is roughly similar in thickness to the electrolyte, about 30 microns to about 100 microns (0.03 millimeter to 0.1 millimeter). The interconnection should be non-porous (over about 95% dense) and preferably be nearly 99% to 100% electronically conductive at 1000° C., the usual operating temperature of a fuel cell.

The interconnection must also have a coefficient of thermal expansion close to that of the solid electrolyte, and the electrode onto which it is deposited, and the other components, including the support tube, if used. The usual interconnection material is doped lanthanum chromite, of approximately 20 microns to 50 microns 0.02 millimeter to 0.05 millimeter) thickness. Usually, an electrically conductive layer 28 is deposited over the interconnection 26. This layer 2S is preferably comprised of the same material as the fuel anode 20, nickel or cobalt zirconia cermet, and about the same thickness, 100 microns.

Undoped lanthanum chromite is not very useful as an electronic interconnection, due to its combination of marginal conductivity, mismatch of thermal expansion coefficient with the rest of the fuel cell components, and phase transition from orthorhombic to rhombohedral near 275° C. In the method of this invention at least one of Ca, Sr, Co, Ba, and Mg can be diffused as a dopant throughout the interconnection material 26.

A suspension of metal oxide particles or agglomerates, where the metal is selected from the group consisting of Ca, Sr, Co, Ba, Mg, and mixtures thereof, such as CaO, CaO$_2$, SrO, SrO$_2$, CoO, Co$_2$O$_3$, BaO, BaO$_2$, MgO, MgO$_2$, and the like, in a fugitive binder, such as water, alcohol, and the like, can be applied, by brushing, spraying, etc., to a selected portion of the top first surface of a porous, metal oxide, electrode tube structure, such as strontium doped lanthanum manganite, the preferred air electrode material. The metals Ca, Sr, Co, Ba, and Mg are useful because they have a high diffusivity in perovskite structures, from approximately $10^{-12}$ cm$^2$/sec to $10^{-6}$ cm$^2$/sec at from 1,200° C. to 1,300° C., and will easily diffuse throughout the interconnection material. Calcium, the easiest to diffuse, is preferred, usually as CaO. Even though materials such as CaO$_2$, SrO$_2$, Co$_2$O$_3$, etc. have low decomposition temperatures, they are useful because they will decompose to CaO, SrO, CoO, etc. form.

A metal carbonate suspension, for example CaCO$_3$, SrCO$_3$, CoCO$_3$, BaCO$_3$ or MgCO$_3$, in water, can also be applied to the top of the air electrode, in which case, upon application of heat, as a separate step or during vapor deposition, the corresponding, particulate metal oxide will be formed. Similarly, metal sulfates or nitrates can be used. Any number of techniques or metal containing materials can be used, as long as a separate layer of discrete metal oxide particles or agglomerates is formed on a specified portion of the air electrode.

Preferably, the particle or agglomerate size of the metal oxide, carbonate, nitrate, sulfate, and the like, will be from approximately 0.5 micron to 15 microns diameter, providing metal oxides on the air electrode within that range. If the metal oxides formed or disposed on the air electrode are greater than 15 microns diameter, a large amount of air electrode-interconnection interface porosity will result after annealing and metal diffusion. The preferred range of metal oxide concentration on the air electrode surface must be such that the halides are readily accessible to the air electrode, and react with the outcoming oxygen through the air electrode surface.

In the next step, a vapor deposition of interconnection material is carried out, generally following the method set out in U.S. Pat. Nos. 4,597,170 and 4,609,562. After particle or agglomeration application and heating over 1,000° C., generally from about 1,300° C. to 1,450° C., a metal halide vapor, comprising lanthanum halide and chromium halide, with optional magnesium halide addition, where the halide is preferably chlorine, is applied to the first, top, specified portion of the porous electrode surface containing the deposited metal containing particles. The halide vapor is applied along with hydrogen gas, and an inert gas, such as argon. A source of oxygen, usually along with steam, is applied to the second, opposite surface of the electrode, here the inside of the tube, so that oxygen contacts halide vapor at the first, top surface of the porous electrode structure.

A reaction time of ½ hour to 2 hours, is allowed for the oxygen to react with the metal halide vapor, and cause a dense lanthanum-chromium oxide structure to grow between and around the deposited layer of metal oxide particles. The metal oxide particles get incorporated into the lanthanum-chromium oxide structure (a solid state solution type effect) as it grows thicker with time on top of the electrode, to a final thickness of approximately 30 microns to 50 microns (0.03 millimeter to 0.05 millimeters). On continued heating, the metal ions of the metal oxide particles will diffuse through the bulk crosssection of the lanthanum-chromium oxide structure, to provide a 95+% dense, top, electronically conductive layer on the porous electrode structure.

Preferably, the interconnection layer is formed after first step heating for approximately ½ hour to 2 hours at 1,300° C. to 1,450° C., after which a second step heat-annealing is carried out for approximately an additional 1 hour to 12 hours at 1,100° C. to 1,400° C. This annealing causes substantially complete diffusion of the dopant Ca, Sr, Co, Ba or Mg from the metal oxide particles into the interconnection material and complete disappearance of the discrete metal oxide particles. Resistance can be reduced from, for example 7,500KΩ to 9kΩ after annealing, where undoped lanthanum chromite was grown as the interconnection layer.

Additionally, before the heat annealing step, additional suspension of metal oxide particles can be applied to the already grown interconnection layer, so that during heat-annealing, metal ion dopant can diffuse from the outer as well as the inner surface of the interconnectio layer. Alternatively, metal carbonates, sulfates or nitrates can be applied which upon heating provide the corresponding metal oxide. In either case, as a separate heating step or during annealing, metal oxide particles are provided on the top surface where they are capable of dissociating to form metal ions for bulk diffusion.

During the initial stages of the interconnection growth process, as the metal ions in the deposited metal oxide get incorporated in the interconnection skeleton matrix, the metal ions contribute oxygen vacancies which facilitate and enhance the transport of oxygen through the interconnection film. The oxygen vacancies and the resulting enhanced oxygen transport increases the overall growth rate of the interconnection film. The increased growth rate allows the interconnection to quickly seal up the air electrode surface, and thus, does not allow prolong contact of the chromium in the gas phase with the Mn in the air electrode. This probably is the cause for the observed decrease in the amount of the Mn-Cr rich second phase when using the method of this invention.

The enhanced oxygen transport during the rest of the vapor deposition maintains a higher oxygen potential at the growing interconnection surface, which allows continuous doping of the interconnection with Mg when magnesium halide is included in the metal halide vapor. Thus, when magnesium halide is used, the presence of metal oxide particles at the air electrode surface increases the level of magnesium doping in the bulk of the interconnection and decreases segregation of magnesium at the air electrode-interconnection interface.

Thermal expansion mismatch is also greatly improved by diffusing Ca, Sr, Co, or Ba into the interconnection layer. For example, at 4 atom percent calcium doping, to provide a $La_{0.8}CaO_3$ interconnection film, the thermal mismatch with the air electrode/electrolyte would only be 2%. $La_{0.9}Ca_{0.1}CrO_3$ would provide a 7% thermal mismatch with the air electrode/electrolyte, and $La_{0.84}Sr_{0.16}CrO_3$ would have practically no thermal expansion mismatch. The preferred, doped, interconnection produced by the method of this invention would have the formula $La_{1-x}M_xCr_{1-y}N_yO_3$, where M is selected from Ca, Sr and Ba, with x=0 to 0.5 and N is selected from with y=0 to 0.1. The value for x and y will usually vary through the thickness of the interconnection layer, depending on the diffusivity of the dopant.

Additional application of a solid electrolyte layer over the remaining portion of the air cathode, if the electrolyte is to be applied after the interconnection, applying a cermet fuel electrode over the electrolyte, and then a cermet coating over the interconnection layer, will complete formation of an electrochemical cell, such as a fuel cell. Each fuel cell is preferably tubular and is electrically connected at least in series to an adjacent fuel cell. The electrical connection is made along the axial length of the interconnect through a metal fiber felt not shown in FIG. 1. A typical cell generates an open circuit voltage of approximately one volt, and multiple cells can be connected in series and in parallel in order to provide a desired system voltage.

The invention will now be illustrated with reference to the following Example.

EXAMPLE

Tubular structures having most of the components shown in FIG. 1 were constructed, with different metal oxide particle densities applied during interconnection formation. A porous, electronically conductive, tubular, strontium doped, lanthanum manganite air electrode structure, supported on a porous, tubular, calcia stabilized zirconia support, was sprayed with aqueous $CaCO_3$ solution, in an axially elongated, interconnection site between masked, air electrolyte material, on a radial segment of the air electrode, shown as 24 in FIG. 1. The support was approximately 2,000 microns (2 millimeters) thick, and the air cathode was approximately 1,000 microns (1.0 millimeters) thick. The interconnection site area was 0.9 cm. wide×30.5 cm. long=27.45 sq.cm. The calcium carbonate particles were 99.9% pure and had diameters less than 10 microns.

Aqueous $CaCO_3$ solutions, 1:1 by volume, containing 1.0 gram, 1.5 grams and 2.0 grams were sprayed over a number of tubes with 27.45 sq.cm. interconnection areas. In each instance, the tube was air dried, leaving a deposit of $CaCO_3$ particles. The tube was then installed in a vacuum vapor deposition apparatus, and heating, up to a temperature of 1,360° C. was started. At about 650° C. to 700° C. the $CaCO_3$ started to decompose to form CaO particles and $CO_2$ gas. The CaO particles were all less than 10 microns diameter. The density of CaO for each solution concentration was 0.015 gram/sq.cm, 0.023 gram/sq.cm, and 0.030 gram/sq.cm, respectively. A useful range would be from about 0.01 gram/sq.cm to about 0.060 gram/sq.cm. When the porous support tube reached 1,360° C., oxygen plus steam was fed through its inside so that oxygen would diffuse to the top of the air electrode. Lanthanum chloride and chromium chloride vapors, along with hydrogen and argon gas, were then fed to contact the CaO particles and air electrode structure, using a process based on that taught in U.S. Pat. Nos. 4,597,170 and 4,609,562.

The oxygen and metal halide vapors started to react at the air electrode top surface, forming a $LaCrO_3$ skeleton on the air electrode, in between the CaO particles. As the reaction continued, the $LaCrO_3$ skeleton grew into a film incorporating the CaO particles. During the course of the reaction the Ca ions from the incorporated particles diffuse into the $LaCrO_3$ film. Calcium has a diffusivity in $LaCrO_3$ at 1,300° C. of about $10^{-6}$ $cm^2$/sec, which is quite high. Vapor deposition reaction was discontinued after approximately 1 hour, providing a non-porous Ca doped $LaCrO_3$ film about 50 microns (0.05 millimeter) thick and about 97% dense.

An annealing period of the tubular structures was continued at 1,200° C., 1,260° C., and 1,360° C. in air for from 1 to 9 hours. Resistance, in KΩ, was measured after vapor deposition and various annealing conditions, using a two point probe on the interconnection film. The solutions containing from 1.0 gram to 2.0 grams of aqueous $CaCO_3$, 0.015 gram/sq.cm to 0.030 gram/sq.Ca doping of the $LaCrO_3$ film. The results are given below in Table 1 below:

TABLE 1

| Sample | Gram 1:1 aqueous $CaCO_3$ sprayed on interconnection site | Resistance (KΩ) after vapor deposition | Annealing Time (hr) | Annealing Temp (°C.) | Resistance (KΩ) after annealing |
|---|---|---|---|---|---|
| 1 | 1.0 | 20,000 | 4 | 1200 | 5000 |
| 2 | 1.0 | 20,000 | 8 | 1200 | 250 |
| 3 | 1.0 | 20,000 | 1 | 1260 | 500 |
| 4 | 1.0 | 20,000 | 9 | 1260 | 70 |
| 5 | 1.0 | 20,000 | 2.5 | 1360 | 15 |
| 6 | 1.5 | 12,000 | 3 | 1360 | 7 |
| 7 | 2.0 | 7,500 | 4 | 1200 | 100 |
| 8 | 2.0 | 7,500 | 8 | 1200 | 10 |
| 9 | 2.0 | 7,500 | 1 | 1260 | 80 |
| 10 | 2.0 | 7,500 | 9 | 1260 | 9 |

Figure 2A:
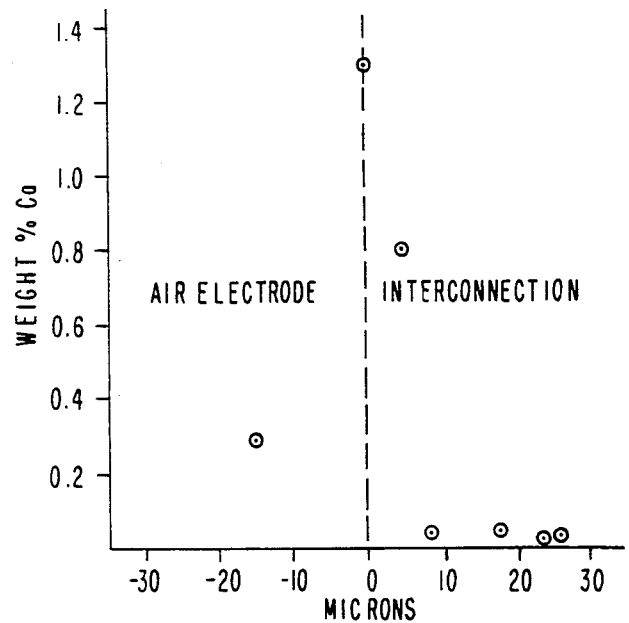
FIGS. 2(a) and 2(b) show Ca diffusion profiles after vapor deposition, and annealing for 9 hours at 1260° C., respectively, for a moderate CaO content.
Figure 2B:
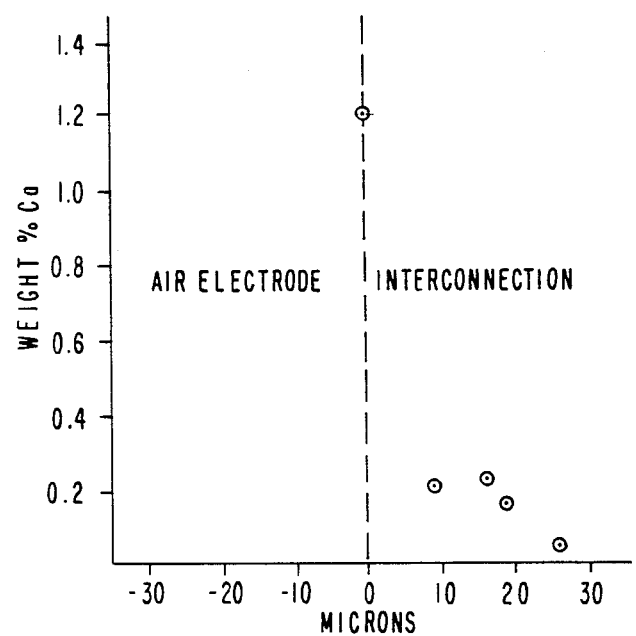
Figure 3A:
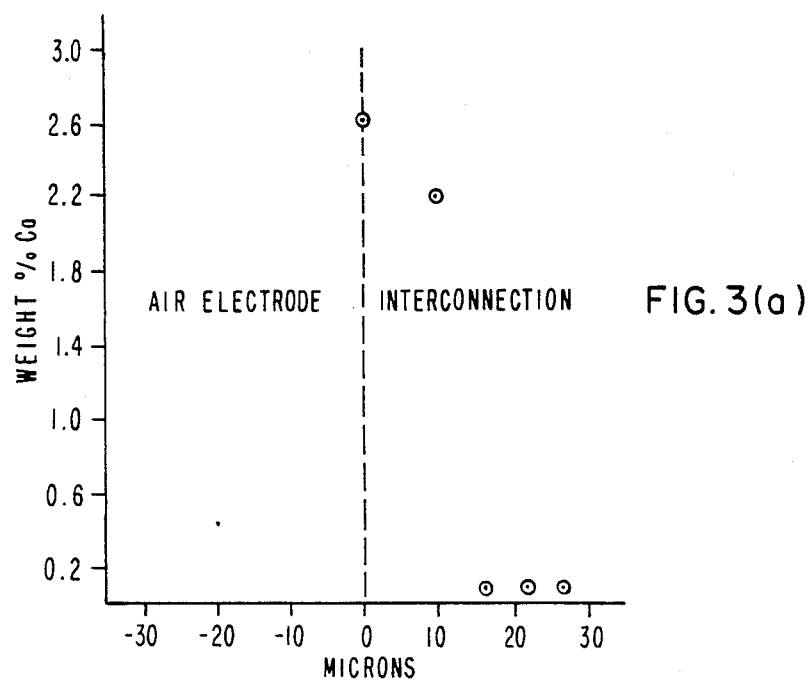
FIGS. 3(a) and 3(b) show Ca diffusion profiles after vapor deposition, and annealing for hours at 1200° C., respectively, for a higher CaO content.
Figure 3B:
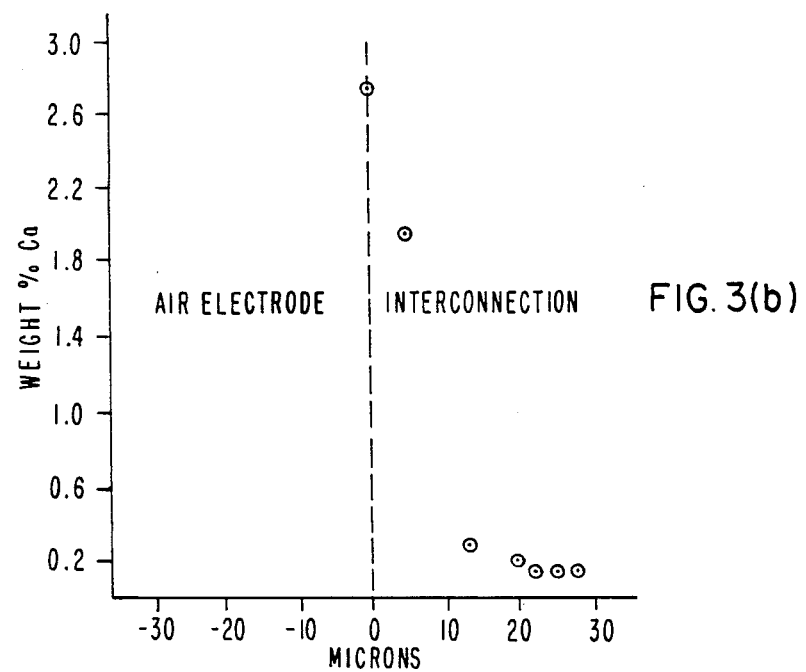

$La_{0.8}Ca_{0.2}CrO_3$ at the air electrode/interconnection interface and $La_{0.98}Ca_{0.02}CrO_3$ at the outer surface of the interconnection, i.e., between approximately 4 atom % inner to 0.4 atom % outer Ca doping, were achieved. As can be seen, complete substitution for Mg can be achieved if desired, with excellent resistance values, as in Samples 4 through 10. Ca X-ray microprobe pictures showed Ca diffusion throughout the interconnection film, confirming the results of Table 1. FIG. 2(a) shows a Ca diffusion profile for Sample 4 after vapor deposition, and FIG. 2(b) shows a Ca diffusion profile for Sample 4 after annealing for 9 hours at 1260° C. FIG. 3(a) shows a Ca diffusion profile for Sample 8 after vapor deposition, and FIG. 3(b) shows a Ca diffusion profile for Sample 8 after annealing for 8 hours at 1,200° C. All these profiles are plotted wt. % Ca vs. distance in microns, with the dashed line indicating the air electrode-interconnection interface. As can be seen, after annealing, the wt. % Ca in the outer portions of the interconnection generally increased by a factor of 5× to 10×.

A residual stress analysis between Sample 5, annealed for 2.5 hours at 1,360° C. and a standard $LaCr_{0.97}Mg_{0.03}O_3$ interconnection, showed that the average compressive stress of the Mg doped interconnection film was about 15 ksi and it did not change much with annealing. The average compressive stress of the Ca doped interconnection (Sample 5) was only 8 ksi, and this value was reduced to about 4 ksi after annealing. This indicates that, residual stress arising from the thermal mismatch between the air electrode and Ca doped interconnection can be ¼ that of that between the air electrode and Mg doped interconnection films. Even if Mg doping is desired, additional doping with Ca, Sr, Co, or Ba by the process of this invention would be advantageous.

In addition to making a Ca doped $LaCrO_3$ interconnection, Ca was also incorporated into a Mg doped $LaCrO_3$ interconnection. Reaction times versus interconnection thicknesses, at the closed end and open end of the tube, during vapor deposition were tabulated in Table 2 below, for Mg doped $LaCrO_3$ interconnections and Ca-Mg doped $LaCrO_3$ interconnections:

TABLE 2

| Position at the Tube | $LaCrO_3$ interconnect doped with Mg; thickness (microns) after 60 minutes | $LaCrO_3$ interconnect doped with Mg and growing around CaO particles, thickness (microns) after 60 minutes |
|---|---|---|
| Open end | 36 | 53 |
| Closed end | 43 | 52 |

As can be seen, thicker interconnection films are produced for a given reaction time when CaO particles are utilized on the air electrode surface, since oxygen transport to the top of the growing film is enhanced where it can continue to react with halide.

Additionally, electron microprobe analysis of sectioned, polished, air-interconnect layers of Mg doped LaCrO$_3$, and Ca, Mg doped LaCrO$_3$ where CaO particles were utilized on the air electrode, showed an inverse correlation between the amount of Mn-Cr second phase at the air electrode surface and the amount of CaO at the air electrode interconnection surface.

Thus, discrete, particulate CaO on the air electrode outer surface accentuates the growth of the interconnection film and does not allow prolonged contact of the chromium in the gas phase and the Mn in the air electrode. The resistance of Mg dope LaCrO$_3$ interconnection films after vapor deposition, as measured by a two point probe range from 20K$\Omega$ to 2,000K$\Omega$. In comparison, Mg doped LaCrO$_3$ interconnection films deposited over CaO particles have a resistance range from 10K$\Omega$ to only 20K$\Omega$. This suggests that the level of Mg-doping in the bulk of the interconnection film, deposited by the new technique of this invention is higher than that obtained by standard techniques. Also, X-ray maps for Mg in the interconnection film deposited over CaO particles, do not show any major segregation of Mg at the air electrode-interconnection interface, providing more uniform Mg doping. Sr oxide particles will also produce similar effects and results.

In the instance of structures having Ca, Mg doped LaCrO$_3$ interconnections on supported air electrode segments, and utilizing CaO particles in the initial steps, dense yttria stabilize zirconia solid electrolyte, about 50 microns (0.05 millimeter) thick was deposited on air electrode material, and porous nickel-yttria stabilized zirconia fuel electrode material was deposited on electrolyte, both by vapor deposition, to provide fuel cell structures, which were operated to generate electrical current.

We claim:

1. A method of bonding a dense, electronically conductive interconnection layer on a porous, electronically conductive, electrode structure, comprising the steps:
   (A) forming a layer of metal oxide particles, where the metal is selected from the group consisting of Ca, Sr, Co, Ba, Mg, and mixtures thereof on a portion of a first surface of a porous, electronically conductive, electrode structure;
   (B) heating the electrode structure;
   (C) applying metal halide vapor comprising lanthanum halide and chromium halide to said first surface of the porous electrode structure and applying a source of oxygen to a second, opposite surface of the porous electrode structure, so that oxygen contacts the metal halide vapor at said first surface of the electrode, to cause a reaction of the oxygen with the metal halide vapor and cause a dense, lanthanum-chromium oxide structure to grow from the first electrode surface, between and around the metal oxide particles, where metal ions in the metal oxide particles start to diffuse into the lanthanum-chromium oxide structure as it grows thicker with time; and
   (D) heat annealing the electrode-lanthanum-chromium oxide structure in air, at a temperature and for a time effective to further cause the metal ions in the metal oxide particles to diffuse throughout the bulk of the lanthanum-chromium oxide structure; to provide a dense, top, electronically conductive interconnection layer on the porous electrode structure, with complete disappearance of the metal oxide particles.

2. The method of claim 1, where the metal oxide particles are CaO particles having a diameter of less than about 15 microns.

3. The method of claim 1, where the halides applied in step (C) are lanthanum chloride and chromium chloride, heating in step (B) is over 1,000° C., the porous electrode structure is an air electrode, solid electrolyte is applied to the uncovered portion of the first surface of the air electrode, and a fuel electrode is applied to the solid electrolyte, to provide an electrochemical cell.

4. The method of claim 1, where the metal oxide particles are formed in step (A) by heating the corresponding metal carbonate, sulfate or nitrate.

5. The method of claim 1, where the coverage of the metal oxide particles on the electrode structure is an amount effective to allow metal halide vapor to contact the first surface of the porous electrode structure and react with oxygen, and where the incorporated metal ions contribute oxygen vacancies in step (C) and enhance oxygen transport, causing an increase of the growth rate, sealing of the electrode structure, and reduction of chromium halide contact with the electrode structure.

6. The method of claim 1, where, in step (C), hydrogen gas is used with the halide vapor at from 1,300° C. to 1,450° C. for ½ hour to 2 hours to grow the lanthanum-chromium oxide structure, and in step (D), the electrode-lanthanum-chromium oxide structure is then annealed in air at 1,100° C. to 1,400° C. for 1 hour to 12 hours.

7. The method of claim 1, where, in step (C) magnesium halide vapor is also applied, so that a magnesium doped lanthanum chromite top conductive layer is formed, and where the porous electrode structure is composed of strontium doped lanthanum manganite.

8. The method of claim 1, where, after the lanthanum-chromium oxide structure is grown, and before annealing, a layer of metal oxide particles, where the metal is selected from the group consisting of Ca, Sr, Co, Mg, and mixtures thereof, are formed on top of the grown lanthanum-chromium oxide structure, and the metal ions in the newly added metal oxide also diffuse into the bulk of th lanthanum-chromium oxide structure during step (D).

9. A method of binding a dense, electronically conductive interconnection layer on a porous, tubular, electronically conductive air electrode structure, comprising the steps:
   (A) forming a layer of calcium oxide particles, on a portion of a first surface of a porous, tubular, electronically conductive, air electrode structure;
   (B) heating the electrode structure;
   (C) applying metal halide vapor comprising lanthanum halide and chromium halide to said first surface of the porous air electrode structure and applying a source of oxygen to a second, opposite surface of the porous electrode structure, so that oxygen contacts the metal halide vapor at said first surface of the air electrode, to cause a reaction of the oxygen with the metal halide vapor and cause a dense, lanthanum-chromium oxide structure to grow from the first electrode surface, between and around the calcium oxide particles, where calcium ion in the calcium oxide particles start to diffuse into the lanthanum-chromium oxide structure as it grows thicker from time; and (D) heat annealing the air electrode-lanthanum-chromium oxide structure in air, at a temperature of from 1,100° C. to 1,400° C., for 1 hour to 12 hours, to further cause the calcium ions in the calcium oxide particles to diffuse throughout the bulk of the lanthanum-chromium oxide structure; to provide a dense, top, electronically conductive interconnection layer on the porous tubular air electrode structure, with complete disappearance of the metal oxide particles.

10. The method of claim 9, where solid electrolyte is applied to the uncovered portion of the first surface of the air electrode, and a fuel electrode is applied to the solid electrolyte, to provide an electrochemical cell.

11. The method of claim 9, where the calcium oxide particles are CaO particles having a diameter of less than about 15 microns, and where the density of the CaO particles in step (A) is from about 0.01 gram/sq.cm to about 0.06 gram/sq.cm.

12. The method of claim 9, where heating in step (B) is from 1,300° C. to 1,450° C. the reaction time in step (C) is from ½ hour to 2 hours, 13. The method of claim where, in step (C) magnesium halide vapor is also applied.

14. The method of claim g, where the halides applied in step (C) are lanthanum chloride and chromium chloride.

15. The method of claim 9, where after step (C) a layer of calcium oxide particles are formed on top of the grown lanthanum-chromium oxide structure, which particles dissociate and the calcium ions also diffuse throughout the bulk of the lanthanum-chromium oxide structure.

16. The method of claim 1, where the heat annealing is carried out at a temperature of from 1,100° C. to 1,400° C., for 1 hour to 12 hours.

17. The method of claim 9, where the coverage of the calcium oxide particles on the electrode structure is an amount effective to allow metal halide vapor to contact the first surface of the porous electrode structure and react with oxygen, and where the incorporated calcium ions contribute oxygen vacancies in step (C) and enhance oxygen transport, causing an increase of the growth rate, sealing of the electrode structure, and reduction of chromium halide contact with the electrode structure.

* * * * *